US012727391B2

(12) United States Patent
Schaller et al.

(10) Patent No.: US 12,727,391 B2
(45) Date of Patent: Sep. 1, 2026

(54) MAGNETIC FIELD SENSOR WITH MECHANICALLY PROTECTED PERMANENT MAGNET

(71) Applicant: Infineon Technologies AG, Neubiberg (DE)

(72) Inventors: Rainer Markus Schaller, Aichen (DE); Jochen Dangelmaier, Beratzhausen (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 689 days.

(21) Appl. No.: 18/179,700

(22) Filed: Mar. 7, 2023

(65) Prior Publication Data

US 2023/0292626 A1 Sep. 14, 2023

(30) Foreign Application Priority Data

Mar. 10, 2022 (DE) ........................ 102022105706.2

(51) Int. Cl.
*H10N 50/10* (2023.01)
*H10N 50/01* (2023.01)
*H10N 50/80* (2023.01)

(52) U.S. Cl.
CPC ............. *H10N 50/10* (2023.02); *H10N 50/01* (2023.02); *H10N 50/80* (2023.02)

(58) Field of Classification Search
CPC ........ H10N 50/10; H10N 50/01; H10N 50/80; H10N 52/101; H10N 52/80; G01R 33/0052; G01R 33/02; G01R 33/093
See application file for complete search history.

(56) References Cited

U.S. PATENT DOCUMENTS 5,964,028 A * 10/1999 Buse .................... H02K 49/106 164/112
9,304,175 B2 4/2016 Kraemer et al.
2004/0212360 A1 10/2004 Sato et al.
2005/0110166 A1* 5/2005 Aoyagi ............... H01L 25/0657 257/781
2007/0194787 A1* 8/2007 Takahashi .............. G01R 33/09 324/252
2009/0045809 A1* 2/2009 Kasajima ............... B82Y 25/00 324/252
2009/0058413 A1* 3/2009 Kraemer ................ B82Y 25/00 324/252

(Continued)

FOREIGN PATENT DOCUMENTS

AU 2003257500 A1 5/2004
CN 1532958 A 9/2009

(Continued)

*Primary Examiner* — S M Sohel Imtiaz
(74) *Attorney, Agent, or Firm* — Harrity & Harrity, LLP

(57) ABSTRACT

A magnetic field sensor having a semiconductor chip is proposed, the semiconductor chip having at least one magnetic field sensor element, the semiconductor chip being embedded in a semiconductor chip encapsulation, having a permanent magnet, the permanent magnet being embedded in a magnet encapsulation, wherein an interface between the semiconductor chip encapsulation and the magnet encapsulation extends as far as a free surface of the magnetic field sensor. Methods for producing a magnetic field sensor are furthermore disclosed.

11 Claims, 6 Drawing Sheets

(56) References Cited

U.S. PATENT DOCUMENTS

| | | | | |
|---|---|---|---|---|
| 2009/0321923 | A1* | 12/2009 | Swaminathan | H01L 21/563<br>438/122 |
| 2010/0276769 | A1* | 11/2010 | Theuss | B82Y 25/00<br>257/E29.323 |
| 2017/0328963 | A1* | 11/2017 | Schmitt | H10B 61/00 |
| 2021/0011095 | A1* | 1/2021 | Binder | G01R 15/20 |
| 2022/0131071 | A1* | 4/2022 | Lill | H10N 50/10 |

FOREIGN PATENT DOCUMENTS

| | | | |
|---|---|---|---|
| DE | 102014108388 | A1 | 12/2014 |
| DE | 112016006539 | T5 | 11/2018 |
| DE | 102020111626 | A1 | 11/2021 |
| WO | 2007125022 | A1 | 11/2007 |
| WO | 2018066163 | A1 | 5/2017 |

* cited by examiner 0120
0110
0121
0122
0115
0111
0112
0113
0114
0321
0330
0431
0616
0600

0721
0122
0115
0111
0112
0113
0114
0730

0721
0122
0115
0111
0112
0113
0114
0831
0800

0921
0922
0915
0912
0911
0913
0918
0920
0910

1021
0922
0915
0912
0911
0913
0918
1031
1000

1121
1122
1115
1111
1112
1118
1113
1120
1110

1231
1221
1122
1115
1111
1112
1118
1113
1200

1531
1421
1322
1651
1611
1612
1613
1614
1620
1610

1531
1421
1322
1651
1611
1612
1613
1614

1531
1421
1322
1651
1611
1612
1613
1614
1800

1321
1322
1340

1421
1322
1340

1531
1421
1322
1340

1941
1931
1921
1942

1921
1931
2040

2121
1931
2040

2212
2211
2121
1931
2040

2315
2212
2211
2121
1931

2414
2413
2315
2212
2211
2121
1931

2500
2416
2413
2315
2212
2211
2121
1931
2540

2600
2631
2621
2622
2615
2612
2611
2614
2613

2721
2722
2740

2821
2722
2740

2931
2821
2722
2740

3000
2931
2821
2722
2740
3012
3011
3013
3015

3121
3141
3142

3231
3121
3141
3142

3231
3121
3141
3142
3322
3315
3312
3311
3313
3300

MAGNETIC FIELD SENSOR WITH MECHANICALLY PROTECTED PERMANENT MAGNET

CROSS-REFERENCE TO RELATED APPLICATION

This application claims priority to German Patent Application No. 102022105706.2 filed on Mar. 10, 2022, the content of which is incorporated by reference herein in its entirety.

TECHNICAL FIELD

The present invention relates to methods for producing a magnetic field sensor and to magnetic field sensors.

BACKGROUND

Modern magnetic field sensors typically have a semiconductor chip in which a magnetic field sensor element produced by using a semiconductor technology is provided. For many applications, a premagnetization field is an advantage. Often, conventional magnetic field sensors therefore have a permanent magnet for producing this premagnetization field.

A magnetic field sensor having such a permanent magnet is disclosed, for example, in DE 10 2020 111 626 A1.

Magnetic field sensors of the type described above are used for example as camshaft sensors of internal combustion engines, where they are exposed to high thermal and mechanical stresses.

There is therefore a need for a method for producing particularly robust magnetic field sensors with a long lifetime, and for corresponding magnetic field sensors.

This need is met by the subject matter of the main claim and of the alternative independent claims. Advantageous configurations are specified in the dependent patent claims.

SUMMARY

A method for producing a magnetic field sensor is proposed, including: providing a chip carrier, the chip carrier having at least two semiconductor chips, the semiconductor chips each having at least one magnetic field sensor element, providing a magnetic layer carrier, connecting the magnetic layer carrier to the chip carrier, singulation.

A method for producing a magnetic field sensor is furthermore disclosed, including: providing a magnetic layer carrier, the magnetic layer carrier including at least one permanent magnet; and selecting a permanent magnet and placing the permanent magnet on a magnetic sensor chip.

Lastly, a magnetic field sensor having a semiconductor chip is proposed, the semiconductor chip having at least one magnetic field sensor element, the semiconductor chip being embedded in a semiconductor chip encapsulation, having a permanent magnet, the permanent magnet being embedded in a magnet encapsulation, wherein an interface between the semiconductor chip encapsulation and the magnet encapsulation extends as far as a free surface of the magnetic field sensor.

BRIEF DESCRIPTION OF THE DRAWINGS

Aspects of various example of magnetic field sensors and methods for producing magnetic field sensors will now be explained with the aid of the figures, in which.

DETAILED DESCRIPTION

Figures 1, 2, 3, 4, 5, 6:
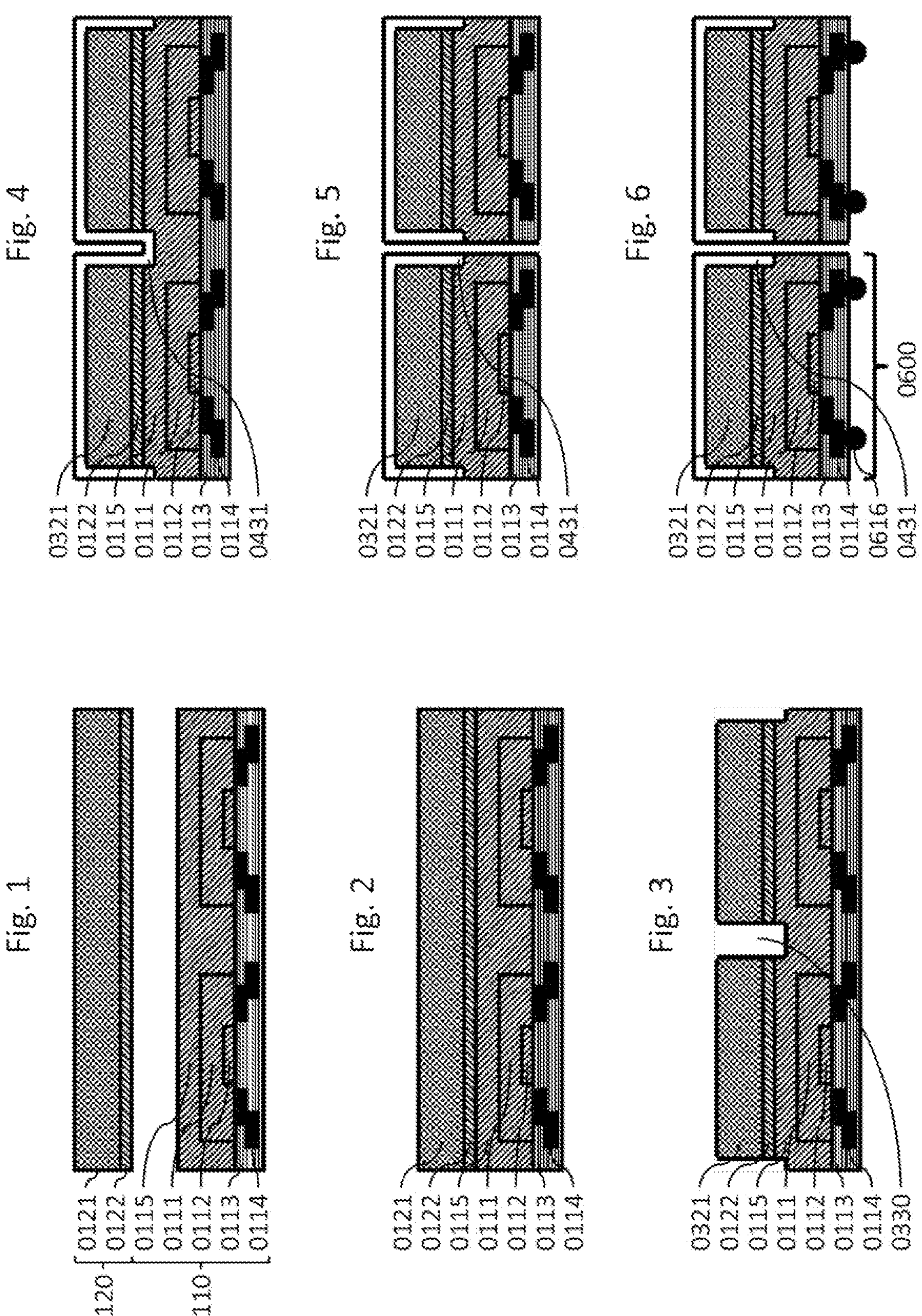
FIG. 1 shows a step in the production of a first magnetic sensor.
FIG. 2 shows a further step in the production of the first magnetic sensor.
FIG. 3 shows a further step in the production of the first magnetic sensor.
FIG. 4 shows a further step in the production of the first magnetic sensor.
FIG. 5 shows a further step in the production of the first magnetic sensor.
FIG. 6 shows a further step in the production of the first magnetic sensor.

FIG. 1 shows a chip carrier 0110 and a magnetic layer carrier 0120. The chip carrier 0110 has at least two semiconductor chips 0111. The semiconductor chip 0111 comprises a magnetic field sensor element 0112. Typically, the chip carrier 0110 has a very large number of semiconductor chips 0111. For example, the chip carrier 0110 may have more than 100, in particular more than 500, in particular more than 1000 semiconductor chips 0111, in particular identical semiconductor chips.

The magnetic field sensor element 0112 is a resistive magnetic field sensor element 0112. In principle, however, it is likewise conceivable to use a Hall effect-based magnetic field sensor element.

The chip carrier 0110 furthermore has an intermediate wiring layer 0113. This provides lines 0114 by which contacts of the semiconductor chip 0111 may be connected to outer-lying contacts. The intermediate wiring layer may be configured as a single-layer or multilayer polymer film. The semiconductor chips 0111 are embedded in a semiconductor chip encapsulation 0115.

The magnetic layer carrier 0120 comprises a magnetic layer 0121 and an adhesive layer 0122. The magnetic layer may be produced from a sintered material, in particular sintered ferrite material. The adhesive layer 0122 may also be provided as part of the chip carrier 0110. It would likewise be conceivable for both the chip carrier 0110 and the magnetic layer carrier 0120 to have an adhesive layer.

In FIG. 2, the magnetic layer carrier 0120 and the chip carrier are represented in a state connected to one another.

The chip carrier 0110 may have rectangular dimensions of more than 100 mm by 100 mm, in particular more than 200 mm by 200 mm. The semiconductor chips 0111 of the chip carrier 0110 may be arranged at well-defined positions of the chip carrier 0110. It is also conceivable for the chip carrier 0110 to have substantially circular dimensions with a diameter of more than 190 mm, in particular more than 290 mm. The dimensions of the chip carrier 0110 may, in particular, correspond to the size of a wafer. This may make it possible to use already available systems for the processing and transport of the chip carrier 0110. In particular, individual preparation of production devices may possibly be obviated. The dimensions of the magnetic layer carrier 0120 may correspond to the dimensions of the chip carrier 0110, so that the chip carrier 0110 and the magnetic layer carrier 0120 may simply be placed congruently on one another during assembly.

As represented in FIG. 3, the magnetic layer 0121 of the magnetic layer carrier 0120 may be subdivided into a multiplicity of permanent magnets 0321. This may, for example, be done by sawing. FIG. 3 represents trenches 0330 which separate the permanent magnets 0321 from one another. The trenches 0330 may extend through the adhesive layer 0122 and into the semiconductor chip encapsulation 0115. The alignment of the trenches 0330 may in this case be selected in such a way that contact with the semiconductor chips 0111 located at predefined positions of the chip carrier 0110 can be avoided in the chip carrier 0110. The permanent magnets 0321 separated from one another using the trenches 0330 may substantially have the dimensions of a cuboid, in particular of a cube.

FIG. 4 shows that the permanent magnets 0321 are covered with a magnet encapsulation 0431. For this purpose, for example, vapor deposition or another coating process, for example spray coating, may be used. It would also be conceivable to produce the covering using an injection molding process. During the covering of the permanent magnets 0321, the trench 0330 may optionally also be filled entirely.

Subsequently, singulation may be carried out. For this purpose, the magnetic layer carrier 0120 and the chip carrier 0110 may be divided fully, as is represented in FIG. 5.

Subsequently, solder balls 0616, by which the magnetic field sensor 0600 can be fastened on circuit boards, may be provided on the opposite side of the intermediate wiring layer from the semiconductor chip 0111. It would also be conceivable to apply the solder balls 0616 before the singulation.

The magnetic field sensor 0600 consequently has a semiconductor chip 0111 and a permanent magnet 0321. The semiconductor chip 0111 comprises at least one magnetic field sensor element 0112 and is embedded in a semiconductor chip encapsulation 0115. An interface between the semiconductor chip encapsulation 0115 and a magnet encapsulation 0431, in which the permanent magnet 0321 is embedded, extends as far as a free surface of the magnetic field sensor 0600. A free surface of the magnetic field sensor 0600 may, in particular, be understood as a surface which is externally visible. In the case of FIG. 6, the interface is configured as a contact face. The magnetic field sensor element 0112 in the magnetic field sensor 0600 shown in FIG. 6 is arranged on a side of the semiconductor chip 0111 facing away from the permanent magnet 0321.

Figures 7, 8, 9, 10, 11, 12:
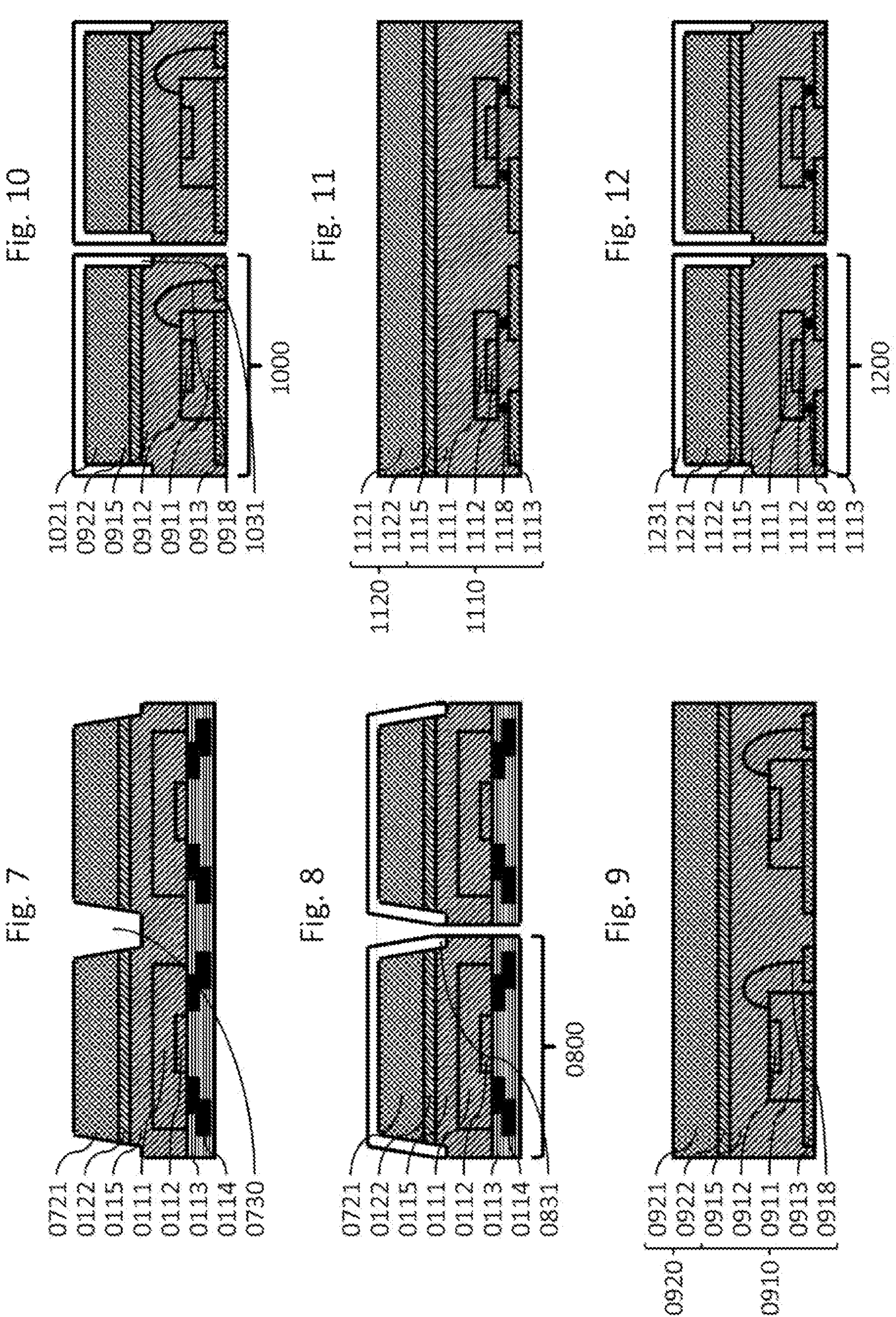
FIG. 7 shows a step in the production of a second magnetic sensor.
FIG. 8 shows a further step in the production of the second magnetic sensor.
FIG. 9 shows a step in the production of a third magnetic sensor.
FIG. 10 shows a further step in the production of the third magnetic sensor.
FIG. 11 shows a step in the production of a fourth magnetic sensor.
FIG. 12 shows a further step in the production of the fourth magnetic sensor.

FIGS. 7 and 8 represent steps in the production of a further magnetic field sensor 0800. In respect of the elements 0122, 0115, 0111, 0112, 0113, 0114, reference is made to the explanations above. According to FIG. 7, the magnetic layer 0121 of the magnetic layer carrier 0120 (cf. FIG. 2) is subdivided into a multiplicity of permanent magnets 0721. Unlike the example represented in FIG. 3, the permanent magnets 0721 are configured not as cuboids but as pyramidal frusta, in particular regular pyramidal frusta, in particular with a rectangular, in particular square base face. These may lead to the development of a premagnetization field which is particularly advantageous in terms of strength and distribution. After the subdivision of the magnetic layer 0121 of the magnetic layer carrier 0120, a coating 0831 may in turn be applied and singulation of the combination of chip carriers and magnetic layer carriers may be carried out in order to obtain the multiplicity of individual magnetic field sensors 0800.

FIG. 9 shows a magnetic layer carrier 0920, connected to a chip carrier 0910, for the production of a further magnetic field sensor. The magnetic layer carrier 0920 in turn has a magnetic layer 0921 and an adhesive layer 0922. The chip carrier 0910 comprises at least two semiconductor chips 0911, each of which has a magnetic field sensor element 0912. The magnetic field sensor element 0912 is arranged on the side of the semiconductor chip 0911 facing toward the magnetic layer carrier 0920. Unlike the chip carrier 0110, in the chip carrier 0910 a lead frame 0913 for the subsequent electrical connection of the magnetic field sensors to an evaluation unit is provided. The electrical contacts of the semiconductor chip 0911 are correspondingly connected electrically to the lead frame 0913 using wires 0918. The semiconductor chip encapsulation 0915, in which the semiconductor chips 0911 are embedded, assists the mechanical connection between the semiconductor chips 0911 and the lead frame 0913. It likewise protects the electrical wire connections 0918 from damage.

FIG. 10 represents the singulated magnetic field sensors 1000. These have a magnet encapsulation 1031 which protects the permanent magnets 1021. The permanent magnets 1021 may be formed from the magnetic layer 0921 in the same way as was explained with reference to FIGS. 3 and 7. The magnet encapsulation 1031 and singulation may be carried out according to FIG. 4, 5 or FIG. 8.

FIG. 11 illustrates a step in the production of a further magnetic field sensor. The magnetic layer carrier 1120 connected to a chip carrier 1110 is used for the production of magnetic field sensors. The magnetic layer carrier 1120 likewise has a magnetic layer 1121 and an adhesive layer 1122. The chip carrier 1110 comprises at least two semiconductor chips 1111, each of which has a magnetic field sensor element 1112. The magnetic field sensor element 1112 is arranged on the side of the semiconductor chip 1111 facing away from the magnetic layer carrier 1120. The chip carrier 1110 has a lead frame 1113 for the subsequent electrical connection of the magnetic field sensors to an evaluation unit.

The electrical contacts of the semiconductor chip 1111 are electrically connected to the lead frame 1113 by solder balls 1118. The semiconductor chip encapsulation 1115, in which the semiconductor chips 1111 are embedded, assists the mechanical and electrical connection between the semiconductor chips 1111 and the lead frame 1113.

FIG. 12 shows the singulated magnetic field sensors 1200. The magnet encapsulation 1231 protects the permanent magnets 1221. The permanent magnets 1221 may be formed from the magnetic layer 1121 in the same way as was explained with reference to FIGS. 3 and 7. The magnet encapsulation 1231 and singulation may be carried out according to FIG. 4, 5 or FIG. 8.

Figures 13, 14, 15, 16, 17, 18:
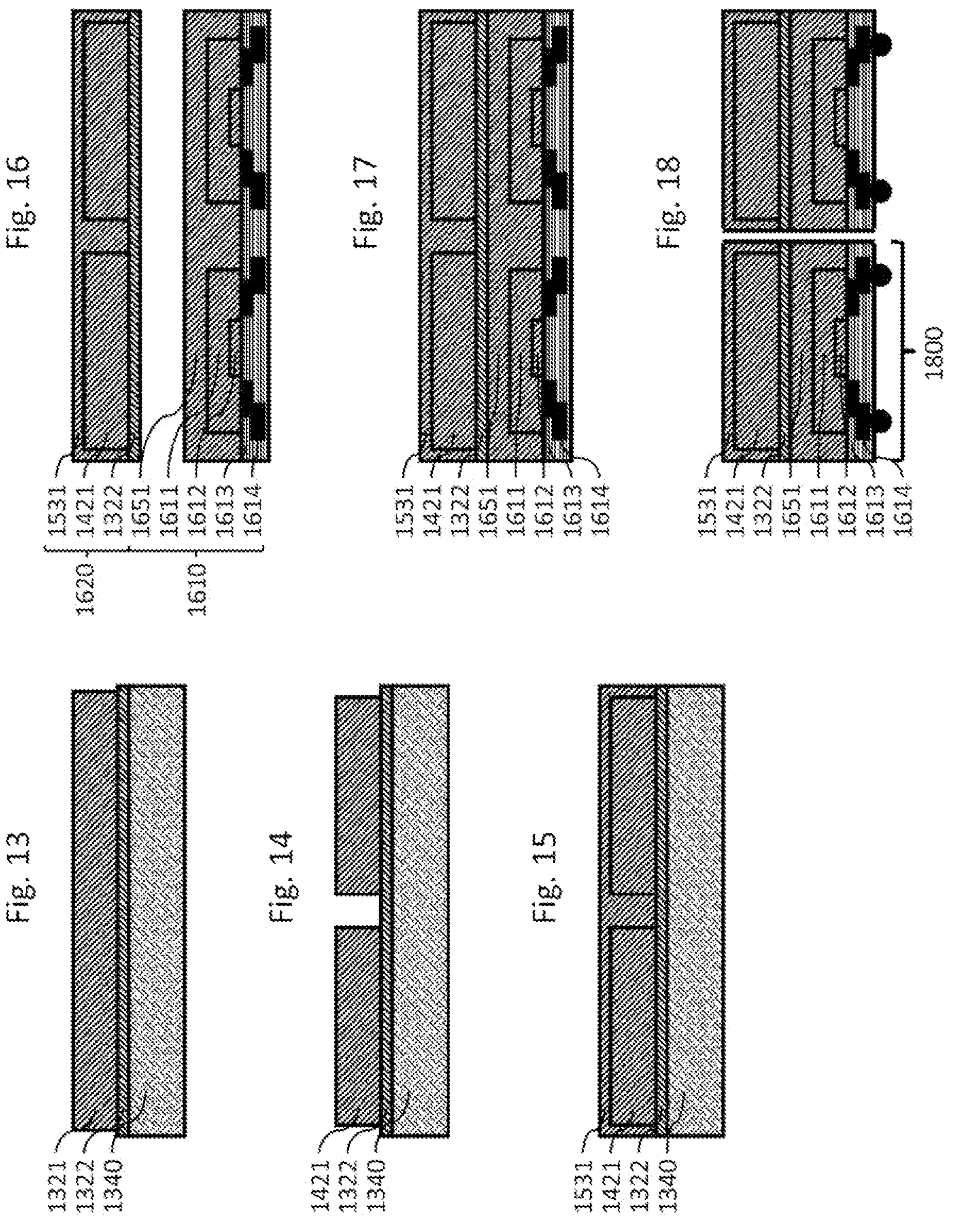
FIG. 13 shows a step in the production of a fifth magnetic sensor.
FIG. 14 shows a further step in the production of the fifth magnetic sensor.
FIG. 15 shows a further step in the production of the fifth magnetic sensor.
FIG. 16 shows a further step in the production of the fifth magnetic sensor.
FIG. 17 shows a further step in the production of the fifth magnetic sensor.
FIG. 18 shows a further step in the production of the fifth magnetic sensor.

FIGS. 13 to 18 show steps in the production of a further magnetic field sensor 1800. According to FIG. 13, a magnetic layer 1321 may be applied on a carrier 1340, in particular a reusable carrier, using an adhesive layer 1322. As illustrated in FIG. 14, permanent magnets 1421 may be produced from the magnetic layer 1321, for example by sawing. The permanent magnets 1421 may have cuboid dimensions. According to FIG. 15, a magnet encapsulation 1531 may subsequently be provided in order to protect the permanent magnets 1421, in particular from mechanical stresses.

According to FIG. 16, the magnetic layer carrier 1620 together with the magnet encapsulation 1531, the permanent magnets 1421 and the adhesive layer 1322 may be lifted off from the carrier 1340 and placed on a chip carrier 1610. The chip carrier 1610 has at least two semiconductor chips 1611, each of which comprises a magnetic field sensor element 1612. The semiconductor chips 1611 are arranged in a semiconductor chip encapsulation 1651.

The chip carrier 1610 may furthermore comprise an intermediate wiring layer 1613, in which conductors 1614 are provided in order to lead electrical connections of the semiconductor chips 1611 outward.

FIG. 17 shows the magnetic layer carrier 1620 and the chip carrier 1610 in a state connected using the adhesive layer 1322.

Subsequently, singulation may be carried out and solder balls may be provided in order to obtain the magnetic field sensor 1800.

Figures 19, 20, 21, 22, 23, 24:
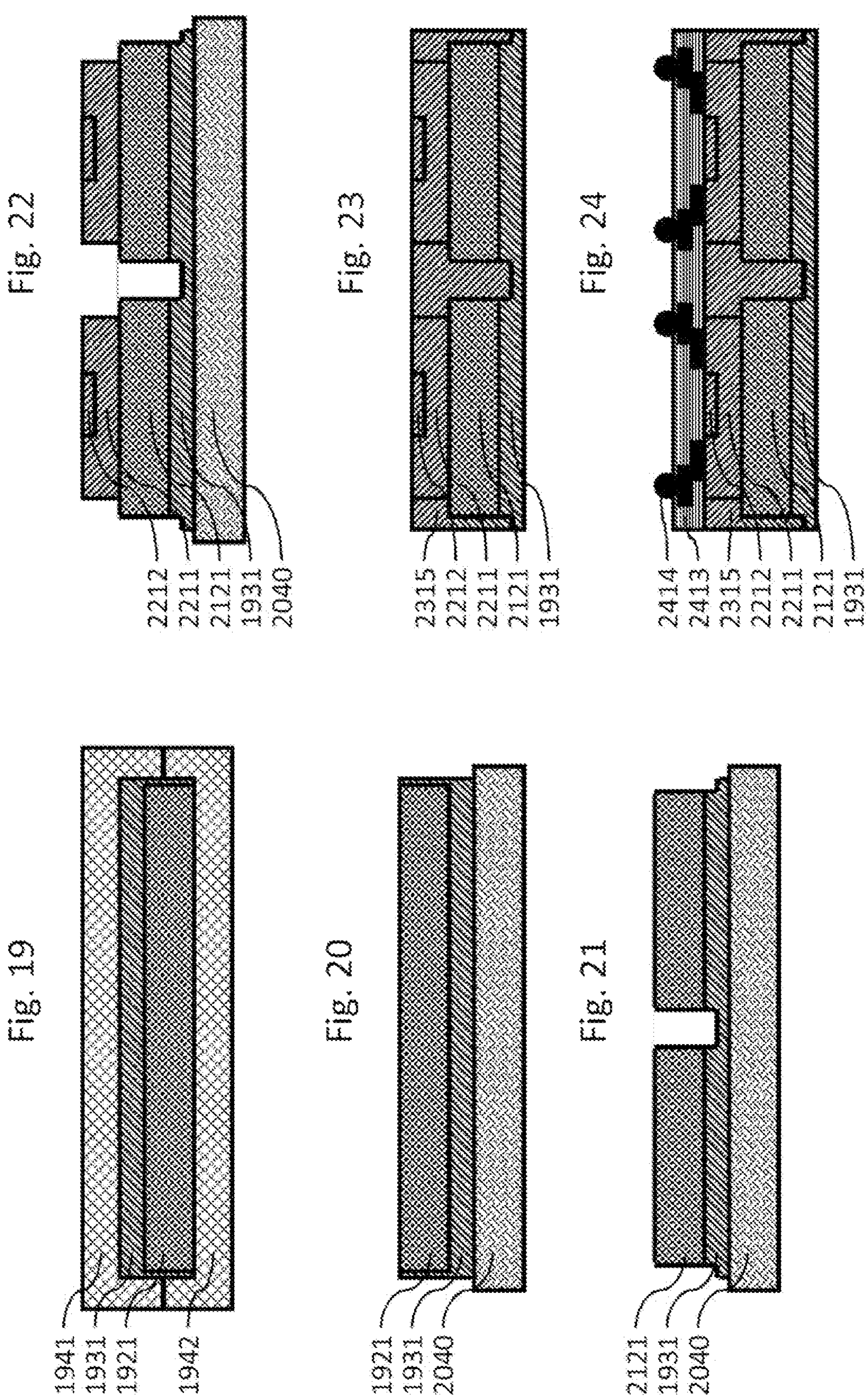
FIG. 19 shows a step in the production of a sixth magnetic sensor.
FIG. 20 shows a further step in the production of the sixth magnetic sensor.
FIG. 21 shows a further step in the production of the sixth magnetic sensor.
FIG. 22 shows a further step in the production of the sixth magnetic sensor.
FIG. 23 shows a further step in the production of the sixth magnetic sensor.
FIG. 24 shows a further step in the production of the sixth magnetic sensor.

FIGS. 19 to 25 illustrate by way of example a further method for producing a magnetic field sensor 2500. A magnetic layer 1921 may be provided with a magnet encapsulation layer 1931 in a mold 1941, 1942 (FIG. 20) and arranged on a carrier 2040, in particular a reusable carrier. The magnetic layer 1921 may be separated into permanent magnets 2121 (FIG. 21). Subsequently, semiconductor chips 2211 which have a magnetic field sensor element 2212 may be arranged on the permanent magnets 2121. The magnetic field sensor element 2212 may in this case, in particular, be provided on the side of the semiconductor chips 2211 facing away from the permanent magnets 2121. The semiconductor chips 2211 may be embedded in a semiconductor chip encapsulation 2315 (FIG. 23). For this purpose, molds may optionally be employed as is shown in FIG. 19. In particular, the semiconductor chip encapsulation 2315 may be made possible by injection molding.

According to FIG. 24, application of an intermediate wiring layer 2413 and the provision of solder balls 2414 may be provided. The stack shown in FIG. 24 may be arranged on a further carrier 2540 and singulated in order to obtain the magnetic field sensors 2500.

Figures 25, 26, 27, 28, 29, 30:
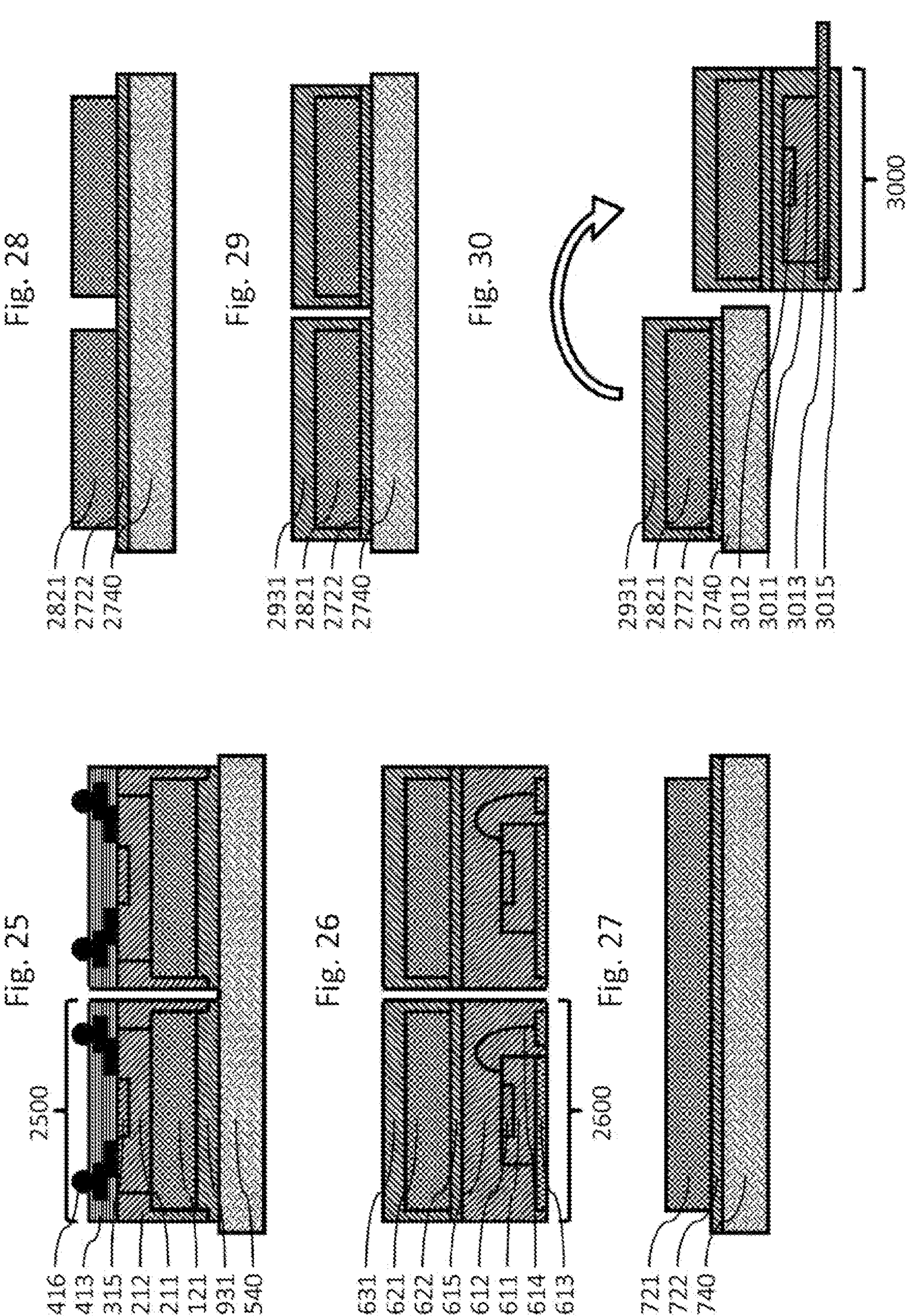
FIG. 25 shows a further step in the production of the sixth magnetic sensor.
FIG. 26 shows seventh magnetic sensors.
FIG. 27 shows a step in the production of an eighth magnetic sensor.
FIG. 28 shows a further step in the production of the eighth magnetic sensor.
FIG. 29 shows a further step in the production of the eighth magnetic sensor.
FIG. 30 shows a further step in the production of the eighth magnetic sensor.

FIG. 26 represents further magnetic field sensors 2600. The elements denoted by the references 2631, 2621, 2622, 2615 may in this case respectively correspond to the elements 1531, 1421, 1322, 1651 according to FIG. 18, and the elements denoted by the references 2615, 2612, 2611, 2614, 2613 may respectively correspond to the elements 0915, 0912, 0911, 0913, 0918 according to FIG. 10.

A further method for producing a magnetic field sensor is represented in FIGS. 27 to 30.

According to FIG. 27, a magnetic layer 2721 may be applied on a carrier 2740, in particular a reusable carrier, using an adhesive layer 2722. As illustrated in FIG. 28, permanent magnets 2821 may be produced from the magnetic layer 2721, for example by sawing. The permanent magnets 2821 may have cuboid dimensions. According to FIG. 29, a magnet encapsulation 2931 may subsequently be provided in order to protect the permanent magnets 2921, in particular from mechanical stresses. The magnet encapsulation 2931 may be produced separately for each permanent magnet 2821. Typically, however, a common magnetic encapsulation layer may initially be provided for all the permanent magnets 2821 located on the carrier 2740, which is then divided into the respective magnet encapsulations 2931 of the permanent magnets 2821. Subsequently, the permanent magnets 2821 provided with the magnet encapsulation 2931 may be taken from the carrier and placed on a magnetic sensor chip in order to obtain the magnetic field sensor 3000. The elements 3012, 3011, 3013, 3015 of the magnetic sensor chip may in this case correspond to the elements 2612, 2611, 2614, 2613.

Figures 31, 32, 33:
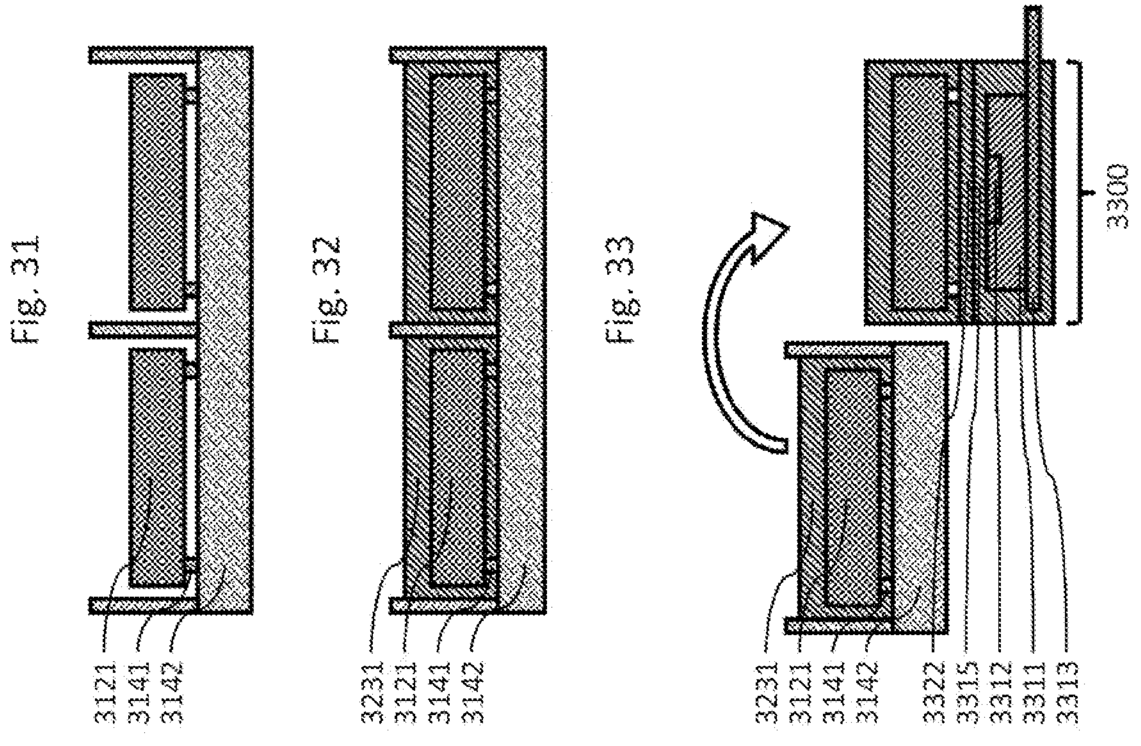
FIG. 31 shows a step in the production of a ninth magnetic sensor.
FIG. 32 shows a further step in the production of the ninth magnetic sensor.
FIG. 33 shows a further step in the production of the ninth magnetic sensor.

FIGS. 31 to 33 also illustrate a method for producing a magnetic field sensor 3300.

According to FIG. 31, permanent magnets 3121 may be arranged in compartments of a mold 3141, 3142. The mold 3141, 3142 has spacers 3141 so that the permanent magnets 3121 have a spacing from the bottom of the compartments. Subsequently, a material for producing a magnet encapsulation 3231 is introduced into the mold 3141, 3142. Except for the places where the spacers 3141 are arranged, the magnet encapsulation 3231 encloses the permanent magnets 3121 substantially fully. The permanent magnets 3121 may have any desired configuration. Subsequently, the permanent magnets 3121 provided with the magnet encapsulation 3231 may be taken from the carrier and placed on a magnetic sensor chip in order to obtain the magnetic sensor 3300. Unlike the example of FIG. 22, the adhesive layer 3322 provided for the connection may be provided on the magnetic sensor chip. The elements 3312, 3311, 3313, 3315 of the magnetic sensor chip may correspond to the elements 2612, 2611, 2614, 2613.

Aspects

Some example implementations will be defined by the following aspects:

Aspect 1. Method for producing a magnetic field sensor (0600, 0800, 1200, 1800) comprising: providing a chip carrier (0110), the chip carrier (0110) having at least two semiconductor chips (0111), the semiconductor chips (0111) each having at least one magnetic field sensor element (0112), providing a magnetic layer carrier (0210), connecting the magnetic layer carrier (0210) to the chip carrier (0110), singulation.

Aspect 2. Method for producing a magnetic field sensor according to Aspect 1, wherein the chip carrier and/or the magnetic layer carrier have rectangular dimensions of more than 100 mm by 100 mm, in particular more than 200 mm by 200 mm, or wherein the chip carrier and/or the magnetic layer carrier have substantially circular dimensions with a diameter of more than 190 mm, in particular more than 290 mm.

Aspect 3. Method for producing a magnetic field sensor according to one of Aspects 1 and 2, wherein a magnetic layer of the magnetic layer carrier is subdivided into a multiplicity of permanent magnets, in particular by sawing, in particular after the connection of the magnetic layer carrier to the chip carrier.

Aspect 4. Method for producing a magnetic field sensor according to one of Aspects 1 to 3, wherein the permanent magnets are covered with a magnet encapsulation, in particular by vapor deposition, coating, spray coating, injection molding.

Aspect 5. Method for producing a magnetic field sensor according to one of Aspects 1 to 4, wherein the chip carrier has an intermediate wiring layer, in particular configured as a polymer film.

Aspect 6. Method for producing a magnetic field sensor according to one of Aspects 1 to 5, wherein the chip carrier comprises a lead frame.

Aspect 7. Method for producing a magnetic field sensor, comprising: providing a magnetic layer carrier, the magnetic layer carrier comprising at least one permanent magnet, selecting a permanent magnet and placing the permanent magnet on a magnetic sensor chip.

Aspect 8. Method for producing a magnetic field sensor according to Aspect 7, wherein the permanent magnet is produced by subdividing, in particular sawing, a magnetic layer of the magnetic layer carrier.

Aspect 9. Method for producing a magnetic field sensor according to Aspect 7 or 8, wherein the permanent magnet is embedded in a magnet encapsulation.

Aspect 10. Method for producing a magnetic field sensor according to Aspect 9, wherein the magnet encapsulation is formed by using a casting mold.

Aspect 11. Method for producing a magnetic field sensor according to one of Aspects 9 and 10, wherein the magnet encapsulation is produced by separating, in particular sawing, a magnet encapsulation layer.

Aspect 12. Method for producing a magnetic field sensor according to one of Aspects 7 to 11, wherein the magnetic sensor chip comprises an intermediate wiring layer, in particular configured as a polymer film.

Aspect 13. Method for producing a magnetic field sensor according to one of Aspects 7 to 12, wherein the magnetic sensor chip comprises a lead frame.

Aspect 14. Magnetic field sensor (0600) having a semiconductor chip (0111), the semiconductor chip (0111) having at least one magnetic field sensor element (0112), the semiconductor chip (0111) being embedded in a semiconductor chip encapsulation, having a permanent magnet, the permanent magnet being embedded in a magnet encapsulation, wherein an interface between the semiconductor chip encapsulation and the magnet encapsulation extends as far as a free surface of the magnetic field sensor.

Aspect 15. Magnetic field sensor according to Aspect 14, wherein the magnetic field sensor is produced by a method according to one of Aspects 1 to 13.

Aspect 16. Magnetic field sensor according to one of Aspects 14 and 15, wherein the interface is an adhesive layer.

Aspect 17. Magnetic field sensor according to one of Aspects 14 and 15, wherein the interface is a contact face.

Aspect 18. Magnetic field sensor according to one of Aspects 14 to 17, wherein the permanent magnet is a cuboid, in particular a cube.

Aspect 19. Magnetic field sensor according to one of Aspects 14 to 18, wherein the permanent magnet is a pyramidal frustum of a pyramid, in particular a regular pyramid, with a rectangular, in particular square base face.

Aspect 20. Magnetic field sensor according to one of Aspects 14 to 19, wherein the magnet encapsulation is produced from a polymer.

Aspect 21. Magnetic field sensor according to one of Aspects 14 to 20, wherein the magnet encapsulation is produced from a nonmagnetic material.

Aspect 22. Magnetic field sensor according to one of Aspects 14 to 21, wherein the magnet encapsulation is produced from an organic material.

Aspect 23. Magnetic field sensor according to one of Aspects 14 to 22, wherein the magnetic field sensor element is arranged on a side of the semiconductor chip facing away from the permanent magnet.

Aspect 24. Magnetic field sensor according to one of Aspects 14 to 23, wherein the magnetic field sensor element is arranged on a side of the semiconductor chip facing toward the permanent magnet.

Aspect 25. Magnetic field sensor according to one of Aspects 14 to 24, wherein the permanent magnet is produced from a sintered material, in particular a sintered ferrite material.

Aspect 26. Magnetic field sensor according to one of Aspects 14 to 25, wherein the magnetic field sensor element comprises a resistive magnetic field sensor element, in particular based on the magnetic tunneling resistance or giant magnetoresistance or colossal magnetoresistive effect; and/or a Hall effect-based magnetic field sensor element.

Although specific example implementations have been illustrated and described in this description, persons with usual technical knowledge will realize that many alternative and/or equivalent implementations may be selected instead of the specific example implementations which are presented and described in this description, without departing from the scope of the implementation as presented. The intention is for this application to cover all adaptations or variations of the specific example implementations which are discussed herein. It is therefore intended for this implementation to be limited only by the claims and the equivalents of the claims.

What is claimed is:

1. A method for producing a magnetic field sensor, comprising:

providing a chip carrier, the chip carrier having at least two semiconductor chips, and the at least two semiconductor chips each having at least one magnetic field sensor element;

providing a magnetic layer carrier;

connecting the magnetic layer carrier to the chip carrier; and singulating the at least two semiconductor chips, including dividing the chip carrier and the magnetic layer carrier, wherein the chip carrier has an intermediate wiring layer configured as a polymer film.

2. The method for producing the magnetic field sensor as claimed in claim 1, wherein at least one of the chip carrier or the magnetic layer carrier have rectangular dimensions of more than 100 mm by 100 mm, or wherein one or more of the chip carrier or the magnetic layer carrier have substantially circular dimensions with a diameter of more than 190 mm.

3. The method for producing the magnetic field sensor as claimed in claim 1, wherein a magnetic layer of the magnetic layer carrier is subdivided into a multiplicity of permanent magnets.

4. The method for producing the magnetic field sensor as claimed in claim 3, wherein the multiplicity of permanent magnets are covered with a magnet encapsulation.

5. The method for producing the magnetic field sensor as claimed in claim 1, wherein the chip carrier comprises a lead frame.

6. A method for producing a magnetic field sensor, comprising:

providing a magnetic layer carrier, the magnetic layer carrier comprising at least one permanent magnet; and selecting a permanent magnet, of the at least one permanent magnet, and placing the permanent magnet on a magnetic sensor chip, wherein the magnetic sensor chip comprises an intermediate wiring layer configured as a polymer film.

7. The method for producing the magnetic field sensor as claimed in claim 6, further comprising:

sawing a magnetic layer of the magnetic layer carrier to produce the permanent magnet.

8. The method for producing the magnetic field sensor as claimed in claim 6, wherein the permanent magnet is embedded in a magnet encapsulation.

9. The method for producing the magnetic field sensor as claimed in claim 8, wherein the magnet encapsulation is formed by using a casting mold.

10. The method for producing the magnetic field sensor as claimed in claim 8, wherein the magnet encapsulation is produced by separating a magnet encapsulation layer.

11. The method for producing the magnetic field sensor as claimed in claim 6, wherein the magnetic sensor chip comprises a lead frame.

* * * * *